United States Patent
Chou et al.

(10) Patent No.: US 7,022,626 B2
(45) Date of Patent: Apr. 4, 2006

(54) DIELECTRICS WITH IMPROVED LEAKAGE CHARACTERISTICS

(75) Inventors: Anthony I. Chou, Beacon, NY (US); Robert Benjamin Laibowitz, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/726,450

(22) Filed: Dec. 2, 2003

(65) Prior Publication Data

US 2005/0118836 A1 Jun. 2, 2005

(51) Int. Cl.
*H01L 21/26* (2006.01)
(52) U.S. Cl. .................. 438/795; 438/775; 438/781
(58) Field of Classification Search ........ 438/795–799, 438/660–663
See application file for complete search history.

(56) References Cited

U.S. PATENT DOCUMENTS

| | | | |
|---|---|---|---|
| 6,420,739 B1 * | 7/2002 | Yokoi | 257/289 |
| 6,525,365 B1 * | 2/2003 | Basceri et al. | 257/310 |
| 2002/0094593 A1 * | 7/2002 | Chiou et al. | 438/29 |
| 2002/0130377 A1 * | 9/2002 | Khare et al. | 257/410 |
| 2003/0190780 A1 * | 10/2003 | Buchanan et al. | 438/216 |
| 2003/0211718 A1 * | 11/2003 | Koyama et al. | 438/591 |

* cited by examiner

*Primary Examiner*—David Nelms
*Assistant Examiner*—Calvin Lee
(74) *Attorney, Agent, or Firm*—Robert M. Trepp; F. Chau & Associates, LLC (57) ABSTRACT

Methods for forming an oxynitride dielectric in a semiconductor device are disclosed. In the method, an oxynitride layer is grown on a semiconductor device. The oxynitride layer is then annealed at a temperature of about 400° C. for about 20 minutes. Further, the annealing may be performed in a nitrogen ambient or a nitrogen ambient including an oxygen concentration of less than about 1 to about 10 parts per billion.

31 Claims, 7 Drawing Sheets

DIELECTRICS WITH IMPROVED LEAKAGE CHARACTERISTICS

TECHNICAL FIELD

The present invention is related generally to methods for forming dielectrics layers within an integrated circuit, and more specifically, to methods of forming oxynitride gate and capacitor dielectrics having improved leakage characteristics within an integrated circuit.

BACKGROUND

As semiconductor devices become more highly integrated, decreasing the thickness of a gate dielectric is one element that enables a continuing decrease in the scaling of silicon CMOS technology to higher performance levels. Thinner gate dielectrics generate a greater inversion charge, and improve short-channel effects by increasing gate control of the channel because the gate dielectric is formed at the interface where the inversion layer is formed and transistor current is conducted.

Pure $SiO_2$ has been the gate dielectrics of choice since the early days of the integrated circuit. However, as gate dielectrics are being scaled into the sub 20Å thickness range, oxynitrides (SiOxNy) have been increasingly used in high performance CMOS processes. The properties of gate dielectrics are low gate leakage current, high dielectric constant to increase capacitance, high mobility, high reliability and improved diffusion barrier properties.

It is important to continue reducing the thickness of gate dielectrics to increase device performance. However, the reduction of the thickness of gate dielectric increases gate leakage, which limits the scaling of oxynitrides gate dielectrics. Further, the increase in gate leakage is becoming an increasingly larger percentage of the total power dissipation within a integrated circuit. Thus, minimizing gate leakage current for a given oxide capacitance is key to achieving high performance integrated circuits. There are similar considerations for capacitor dielectrics, for which capacitance and leakage are the primary metrics.

Figure 1A:
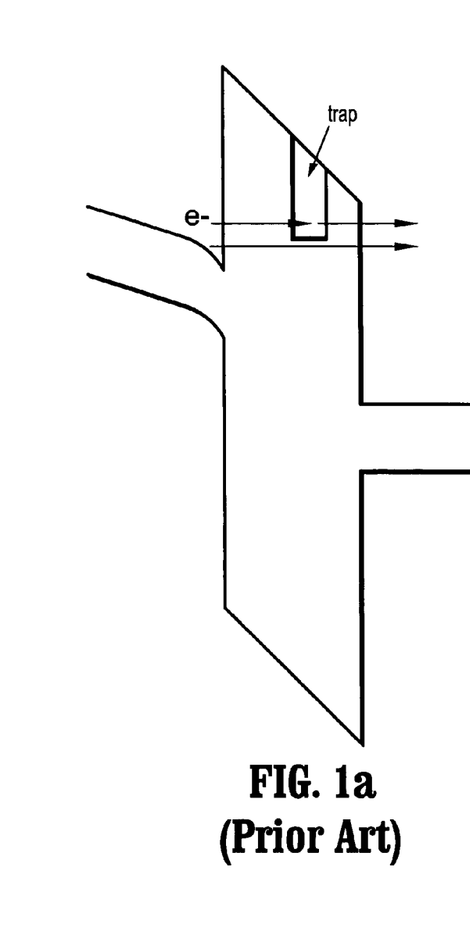
FIGS. 1a–1b illustrate energy band diagrams of a dielectric barrier layer having a trap or reduced barrier height, respectively.
Figure 1B:
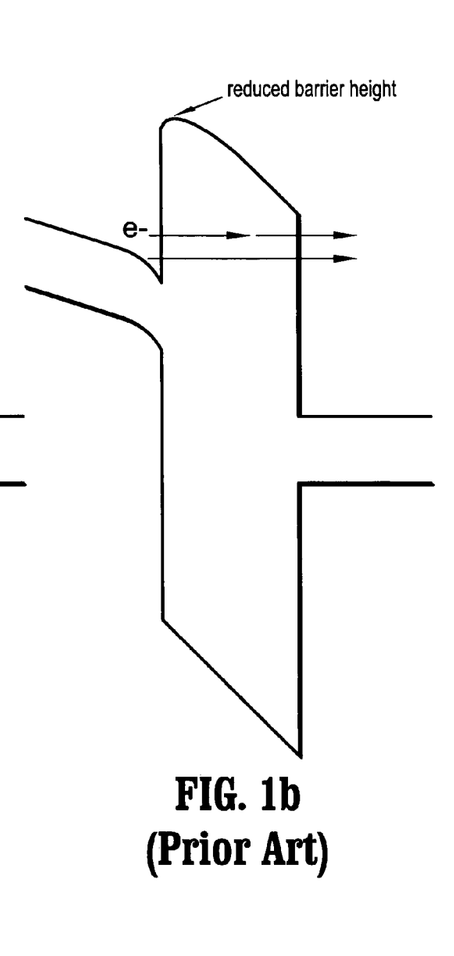

Properly optimized oxynitrides have increased dielectric constants and have lower gate leakage currents at a given capacitive thickness as compared to pure $SiO_2$. However, because some plasma nitridation treatments may damage a gate dielectric and generate defects, which are caused by the presence of energetic radicals and ions within the nitridation plasma during the nitridation process, the leakage current within an integrated circuit may be higher than the intrinsic level of leakage current predicted by the thickness and barrier height of the gate dielectric. Thermal nitridation may also introduce defects and trapping levels. Some of the mechanisms that can increase the gate leakage are a trap-assisted tunneling or barrier height reduction as illustrated in FIGS. 1a and 1b. FIGS. 1a and 1b illustrate energy band diagrams of a dielectric barrier layer having a trap or reduced barrier height, respectively. Reducing or eliminating the defects or damage within a gate dielectric could reduce gate leakage and power dissipation.

Therefore, there is a need for a method to form gate and capacitor dielectrics with a low density of traps and near ideal barrier height to reduce gate leakage and power dissipation within integrated circuits.

SUMMARY OF THE INVENTION

Exemplary embodiments of the present invention include methods for forming dielectric layers that provide reduced current leakage and power dissipation within an integrated circuit.

An exemplary embodiment relates to a method of forming a dielectric layer of a semiconductor device. The method includes growing an oxynitride layer of a semiconductor device, and annealing the oxynitride layer at a temperature of about 400° C. for about 20 minutes. The method may also include annealing the oxynitride layer in a nitrogen ambient or a nitrogen ambient including an oxygen concentration of less than about 1 part per billion.

Another exemplary embodiment relates a method of forming a dielectric layer within a semiconductor device. The method includes growing an oxynitride layer on a semiconductor device, annealing the oxynitride layer at a temperature of about 400° C. for about 20 minutes, wherein the annealing is performed in a nitrogen ambient including an oxygen concentration of less than about 1 part per billion, and capping the annealed oxynitride layer with a gate. The annealing step in the method above may also include pre-heating the semiconductor substrate to a temperature of about 400° C.

Still another exemplary embodiment relates to a method for forming a dielectric layer on a semiconductor device. The method includes growing an oxynitride layer on a semiconductor device in a processing chamber, preheating the semiconductor device to a temperature of about 400° C., annealing the oxynitride layer for about 20 minutes at a temperature of about 400° C., cooling the semiconductor device with the annealed oxynitride layer. The method may also include annealing the oxynitride layer in a nitrogen ambient or a nitrogen ambient including an oxygen concentration of less than 1 to about 10 parts per billion.

Yet another exemplary embodiment relates to a method for forming a dielectric layer on a semiconductor device. The method includes growing an oxynitride layer of a semiconductor device, depositing a gate electrode layer on the oxynitride layer, and annealing the oxynitride layer and the silicon layer at a temperature of about 400° C. for about 20 minutes. The method may also include performing the annealing in a nitrogen ambient or a nitrogen ambient including an oxygen concentration of less than 1 to about 10 parts per billion. Further, a gate electrode layer may be silicon, polysilicon, germanium, silicon-germanium, any other semiconductor material, or a metal.

These and other exemplary embodiments, features and advantages of the present invention will be described and become apparent from the following detailed description of exemplary embodiments when read in conjunction with the accompanying drawings.

DETAILED DESCRIPTION OF EXEMPLARY EMBODIMENTS

The present invention will now be described more fully hereinafter with reference to the accompanying drawings, in which exemplary embodiments of the invention are shown. This invention may, however, be embodied in different forms and should not be construed as limited to the exemplary embodiments set forth herein. Rather, these exemplary embodiments are provided so that this disclosure will be thorough and complete, and will fully convey the scope of the invention to those skilled in the art.

Figure 2:
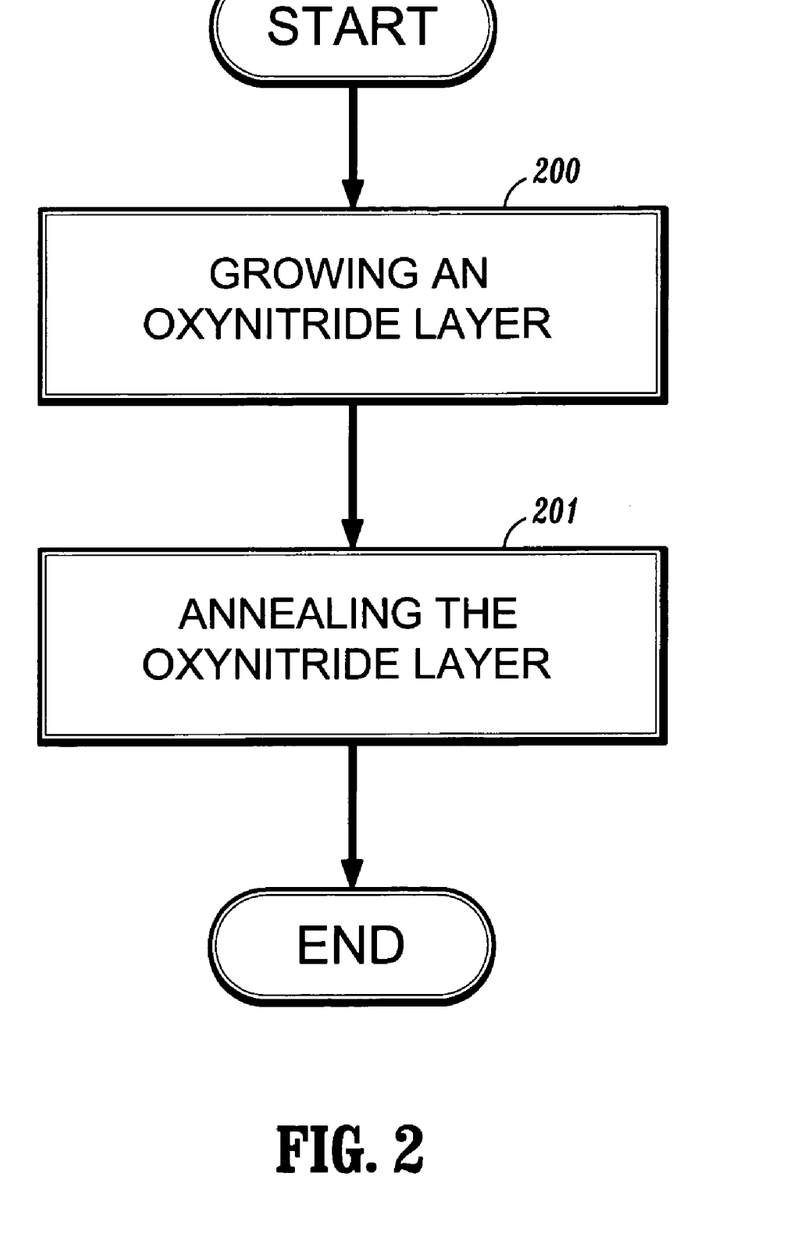
FIG. 2 is a flowchart illustrating a method for forming a dielectric layer in a semiconductor device, according to an embodiment of the present invention.

Exemplary embodiments of the present invention include methods for forming a dielectric layer that provides reduced current leakage and power dissipation within an integrated circuit. FIG. 2 is a flowchart illustrating a method for forming a dielectric layer in a semiconductor device, according to an embodiment of the present invention. Now referring to FIG. 2, an oxynitride film is grown on a semiconductor substrate (Step 200). The oxynitride layer is preferably grown using a plasma nitridation process. Preferably, the oxynitride film is grown to a thickness in a range of about 1.2 to about 2.4 nm. Next, the oxynitride film is annealed at a temperature of about 400° C. for about 20 minutes (Step 201). Further, the annealing may be performed in a nitrogen ambient or a nitrogen ambient having an ultra-low oxygen concentration, e.g., less than 1 to about 10 parts per billion.

Furthermore, the nitridation process may include a thermal or a plasma nitridation process. The thermal nitridation is carried out by exposing a silicon surface or a $SiO_2$ surface to a reactive nitrogen containing gas at a temperature in the range of 650° C. to 1000° C. Preferably, the reactive nitrogen containing gas is $N_2O$, $NH_3$, or NO. The plasma nitridation of oxynitrides may be performed by exposing a silicon surface or a $SiO_2$ surface to an activated nitrogen containing plasma at a temperature in the range of about room temperature to about 800° C.

In addition, it is to be further understood that substrate can be any semiconductor material, including silicon (Si), germanium (Ge), silicon-germanium (Si—Ge), or any other semiconductor material. Alternatively, substrate can be a thin-film or epitaxial layer that is part of a silicon-on-insulator (SOI) substrate.

Various methods for forming a dielectric layer according to exemplary embodiments of the present invention, which are based generally on the method of FIG. 2, will now be described in detail. In addition, it is to be understood that each of the experiments discussed below are related to particular exemplary embodiments where process conditions and materials of the general method as described above have been varied.

In each of the experiments described below, oxynitride dielectric films were grown on a 8-inch silicon device quality wafers. The thickness of these films varied from about 1.2 to about 2.4 nm and were grown using a plasma nitridation process. To make electrical measurements, top electrodes of either aluminum or polysilicon were deposited on the oxynitride films in a patterned array. The films were annealed in several different atmospheres prior to a top electrode deposition, except for experiment 5. In experiment 5, a top electrode was deposited on an oxynitride layer prior to an annealing process.

It is to be further understood that the top electrodes may also comprise silicon, germanium, silicon-germanium, any other semiconductor material, or a metal.

Experiment 1

In an experiment, a first set of samples having an oxynitride film of about 1.7 nm were grown on a silicon wafers using a plasma nitridation process. Before a post dielectric anneal, the current density, J, of a first sample of the first set of samples was determined using an aluminum top electrode having an area of 0.0021 $cm^2$ and applying a 1 volt charge to the first sample having the oxynitride film. The current density for the first sample was determined to be about 0.34 $Amp/cm^2$. Next, a second sample of the first set of samples was annealed prior to the deposition of the aluminum top electrode in a nominally clean nitrogen ambient. The nominally clean nitrogen ambient contained impurities in the several parts per billion range. The temperature during the anneal process was about 400° C. and the duration of the anneal process was approximately 20 minutes. At this low temperature, additional growth of the dielectric is not expected. Aluminum (Al) electrodes were then deposited on the second sample having the same area as the first sample. The current density, J, of the second sample was determined using an aluminum top electrode having an area of 0.0021 $cm^2$ and applying a 1 volt charge to the second sample having the oxynitride film. The current density for the second sample measured about 0.16 $Amp/cm^2$. Thus, a significant decrease in the current density was determined. Indeed, over a 50% decrease in the current density was determined in the second sample as compared to the current density of the first sample.

Experiment 2

In another experiment, a third sample of the first sample set was annealed in accordance with the parameters designated with the second sample discussed above. Except, the annealing was performed in a nitrogen ambient having an oxygen concentration of less than 1 to 10 parts per billion. The low oxygen concentration was achieved by passing the nitrogen through a purifying system containing titanium (Ti). Variation of the partial pressure of the oxygen was also achieved. Then, aluminum electrodes were deposited on the third sample having the same area as the electrodes deposited on the first and second samples. Once again, a 1 volt charge was applied to the third sample resulting in a current density measurement of about 0.13 Amp/cm2. In addition, ultra low oxygen partial pressure minimized any dielectric growth.

Experiment 3

In yet another experiment, a second set of samples was prepared by growing an oxynitride film having a thickness of about 2.4 nm. The current density of a first sample of the second set of samples was determined to be about 0.02 $Amp/cm^2$. After an annealing process in a clean nitrogen ambient was performed on a second sample of the second set of samples, the current density of the second sample was determined to be 0.0041 Amp/cm$^2$. Next, a third sample of the second set of samples was annealed in a nitrogen ambient having an ultra low concentration of oxygen, the current density of the third sample was determined to be about 0.0026 Amp/cm$^2$. The second and third samples tested showed a significant decrease in current leakage as compared to the first sample of the test device.

Experiment 4

In still another experiment, a third set of samples was prepared having an oxynitride film having a thickness of about 1.6 nm. The oxynitride film was grown on a silicon wafer using a plasma nitridation process. The current density of a first sample of the third set was determined to be about 0.8 Amp/cm$^2$. Next, a second sample of the third set was annealed in a clean nitrogen ambient, and the current density of the second sample was determined to be about 0.5 Amp/cm$^2$. A third sample of the third set was annealed in a nitrogen ambient having an ultra low concentration of oxygen, and the current density was determined to be about 0.6 Amp/cm$^2$.

Experiment 5

In yet another experiment, samples of the first through third sample sets were coated with a polysilicon blanket film of about 150 nm thick. In other words, a polysilicon blanket film was deposited on samples prepared in accordance with the first through third sample sets discussed above prior to an annealing process. Then, half of the samples with the polysilicon blanket film were annealed at 400° C. in a nitrogen ambient having an ultra low concentration of oxygen, e.g., less than 1 to about 10 parts per billion. The other half of the samples were processed without any post dielectric annealing.

Electrodes were then formed on the samples by photolithography and RIE, which led to the overall increase in the base level of the current density. However, all the annealed samples showed a decrease in leakage current, sample 1 decreased by only a few percent, sample 2 decreased by almost a factor of about 3.0 and sample 3 decreased by a factor of about 1.7.

Figure 6:
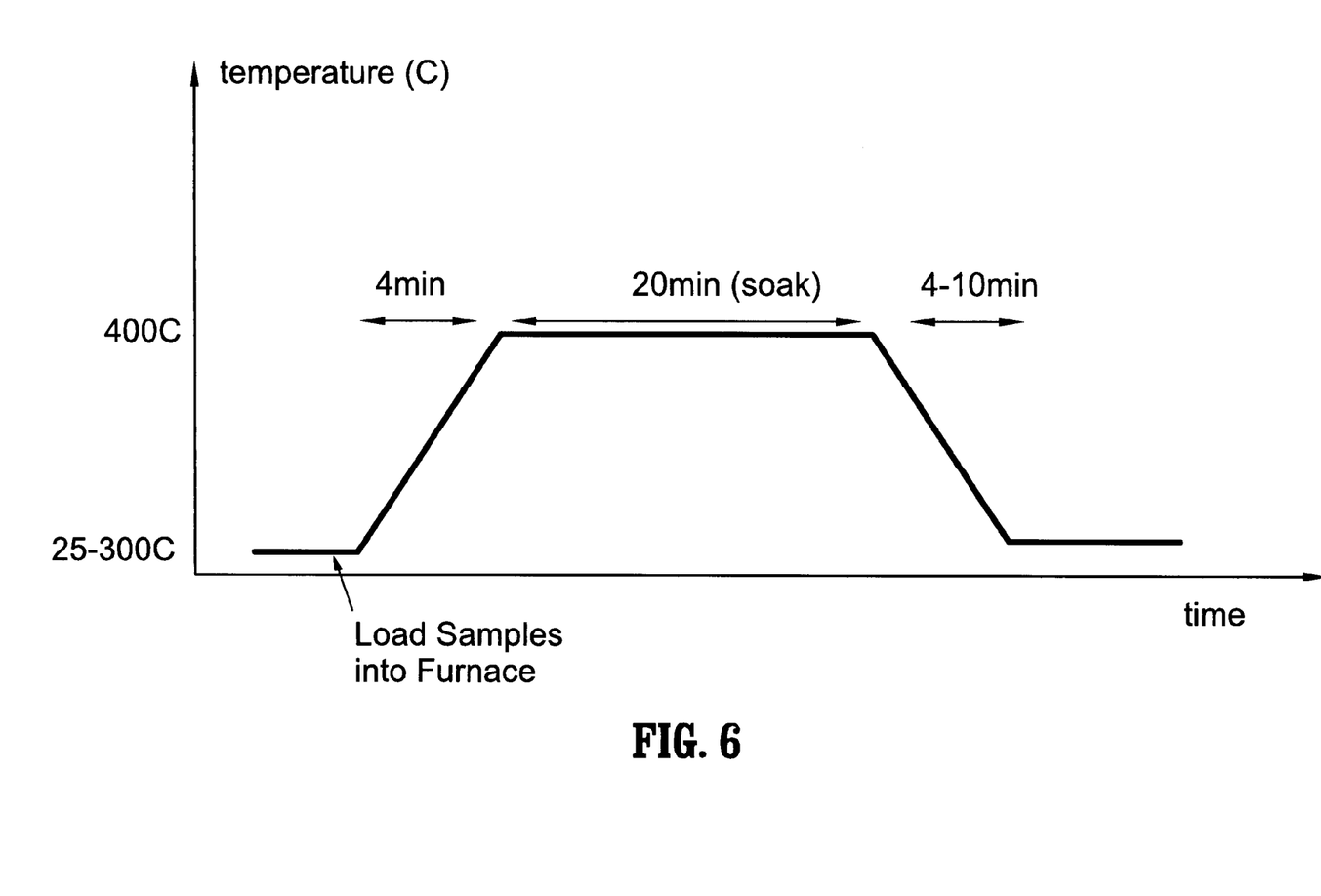
FIG. 6 is a graph illustrating a method for forming a dielectric layer within a semiconductor device, according to an exemplary embodiment of the present invention.

FIG. 6 is a graph illustrating a method for forming a barrier layer within a semiconductor device, according to another exemplary embodiment of the present invention. Referring to FIG. 6, samples of a semiconductor substrate having an oxynitride film are loaded into a processing chamber. The samples are then preheated to a temperature of about 400° C. Preferably, the samples are preheated for about 4 minutes. Next, the oxynitride films are annealed at a temperature of about 400° C. for about 20 minutes. The samples are then allowed to cool during a ramp down for about 4–10 minutes. Preferably, the samples are allowed to cool until the samples reach a temperature in a range of about 25 to about 300° C.

Figure 7:
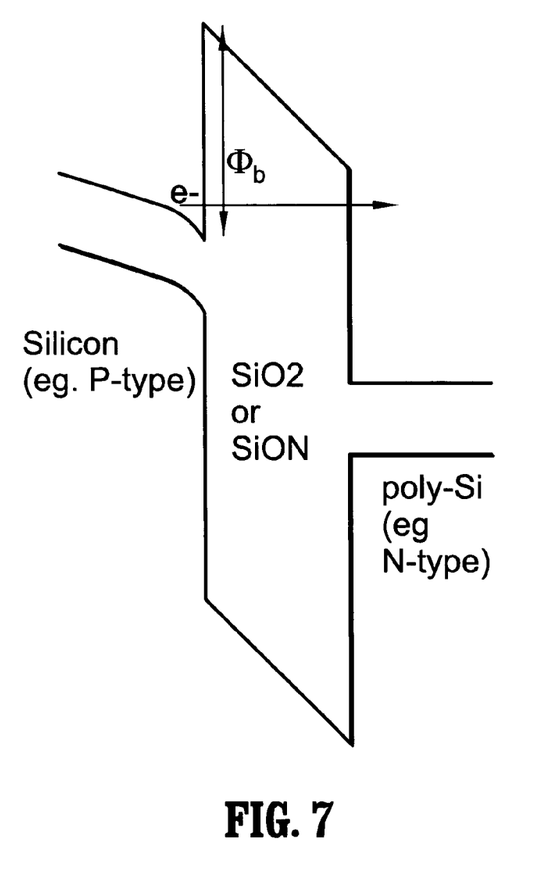
FIG. 7 illustrates an energy band diagram model depicting the improved characteristics of the dielectric layer after performing an annealing process in accordance with embodiments of the present invention.

The benefits of the low temperature anneal according to the embodiments of the present invention are illustrated in FIG. 7, which shows a model of an energy barrier in accordance with the embodiments of the present invention generally encountered in tunneling. More specifically, FIG. 7 illustrates a barrier layer in accordance embodiments of the present invention that is substantially void of any defects and/or impurities, e.g., shown in FIGS. 1a and 1b, and decreases leakage currents and power dissipation of a semiconductor device. Further, defects can reside at interfaces and may be spread out over the energy gap of the insulator resulting in decreased energy levels. The low temperature anneals according to the embodiments of the present invention provide a means of annealing out the defects shown in FIGS. 1a and 1b and lowering the current density, thereby forming a barrier layer as shown in FIG. 7. Furthermore, the energy band diagram as shown in FIG. 7 utilizes a semiconductor as a base electrode and silicon with an energy gap of 1.1 ev is used as an exemplary embodiment.

Extension to other semiconductors such as Germanium, Silicon-Germanium, and any other compound semiconductors would have a similar band diagram as illustrated in FIG. 7. The low temperature annealing would again be beneficial in reducing current leakage and power dissipation within a semiconductor device. The energy band diagram of FIG. 7 is easily modified to include metal electrodes instead of semiconductors. Such metal-insulator-metal junctions are commonly used both for tunnel junctions and decoupling capacitors and reduction of leakage in these systems would follow from the same low temperature annealing process in accordance the embodiments of the present invention.

It is to be further understood that the exemplary methods as described above for forming a dielectric layer according the present invention may be implemented for fabricating various semiconductor devices, e.g., field effect transistors and capacitors.

Figure 3A:
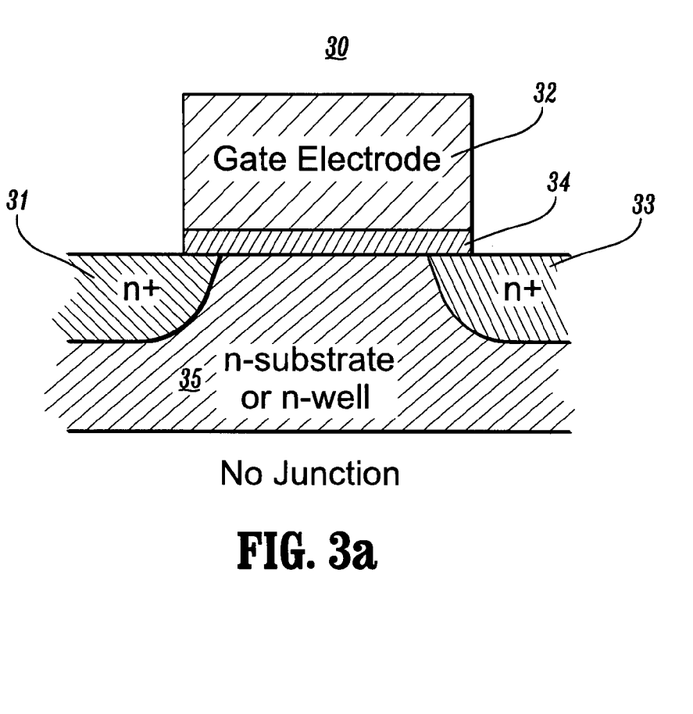
FIGS. 3a–3b are cross-sectional views of a capacitor having a dielectric layer according to an exemplary embodiment of the invention.
Figure 3B:
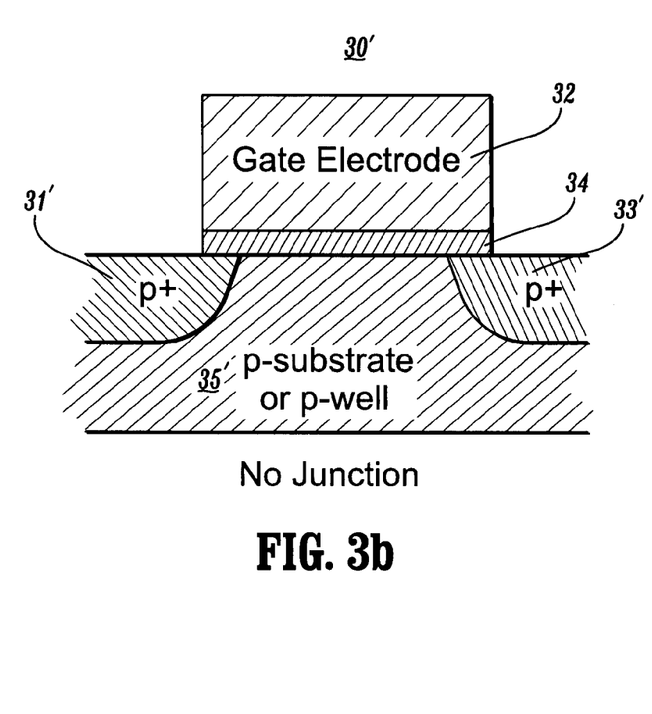

FIGS. 3a–3b are cross-sectional views of a capacitor 30 incorporating a dielectric layer according to another exemplary embodiment of the present invention. Referring to FIG. 3a, a gate dielectric 34 is formed in accordance with the exemplary embodiments discussed above on a n-type substrate 35, or a n-well. Subsequently, a gate electrode 32 is formed on the dielectric layer 34. In addition, n-doped source regions 31 and 33 are formed in a subsequent process.

Referring to FIG. 3b, the capacitor 30' has a similar structure to the capacitor 30 shown in FIG. 3a except that the capacitor 30' includes a p-type substrate 35', or p-well, and p-doped source regions 31' and 33.'

Figure 4:
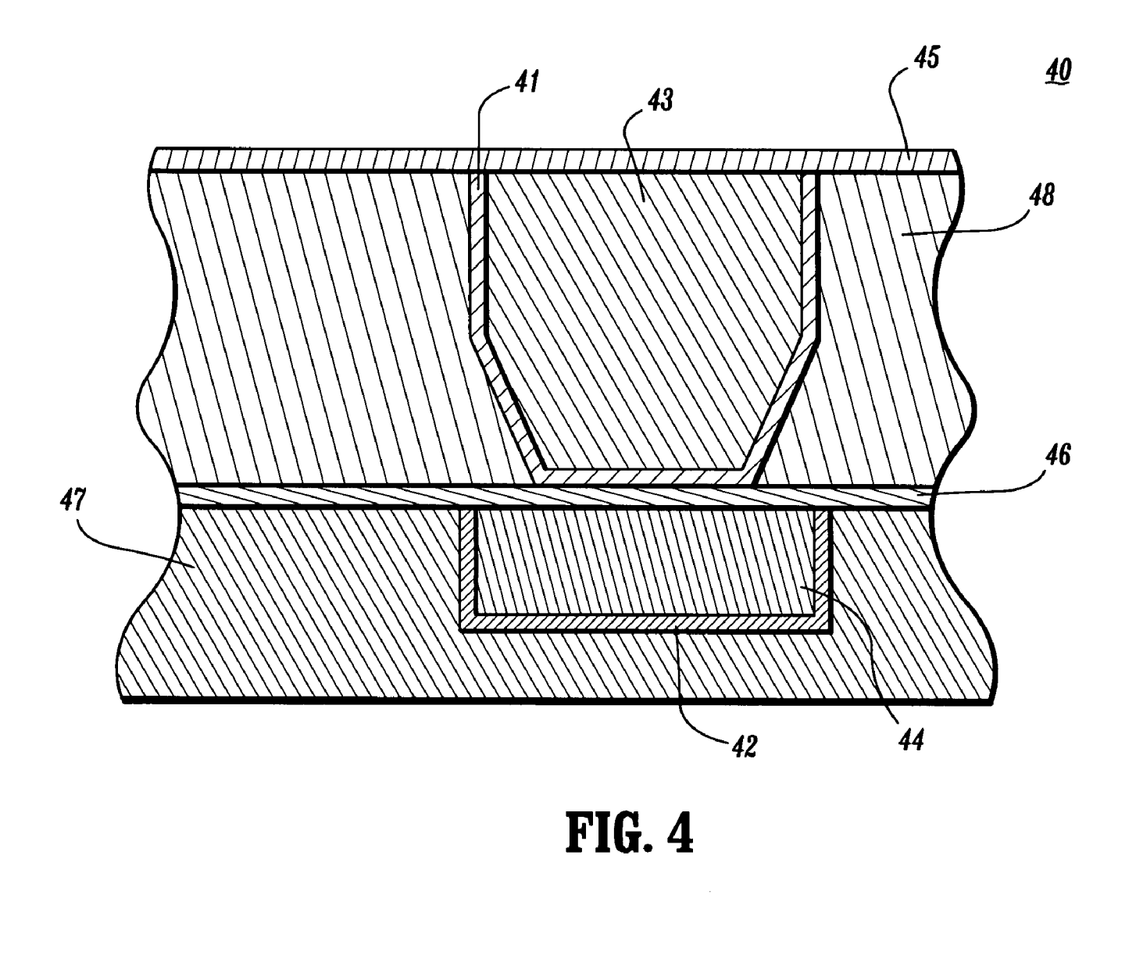
FIG. 4 is a cross-sectional view of a MIM capacitor having a dielectric layer according to an exemplary embodiment of the invention.

FIG. 4 is a cross-sectional view of a MIM capacitor incorporating a dielectric layer according to yet another exemplary embodiment of the present invention. Referring to FIG. 4, a MIM capacitor 40 is shown having a bottom electrode 44 including a liner layer 42 to isolate the bottom electrode 44 formed in a first dielectric layer (47). The capacitor further includes a dielectric barrier layer 46 formed in accordance with the above exemplary embodiments of the present invention. The MIM capacitor 40 also includes an upper electrode 43 formed in a second dielectric layer 48. In addition, a metal barrier layer 41 is interposed between the upper electrode 43 and the second dielectric layer 48 and a portion of the dielectric barrier layer 46 disposed above the bottom electrode 44. Further, the MIM capacitor 40 includes an isolation layer 45 formed on a top portion of the second dielectric layer 48 and on a top portion of the upper electrode 43.

Figure 5:
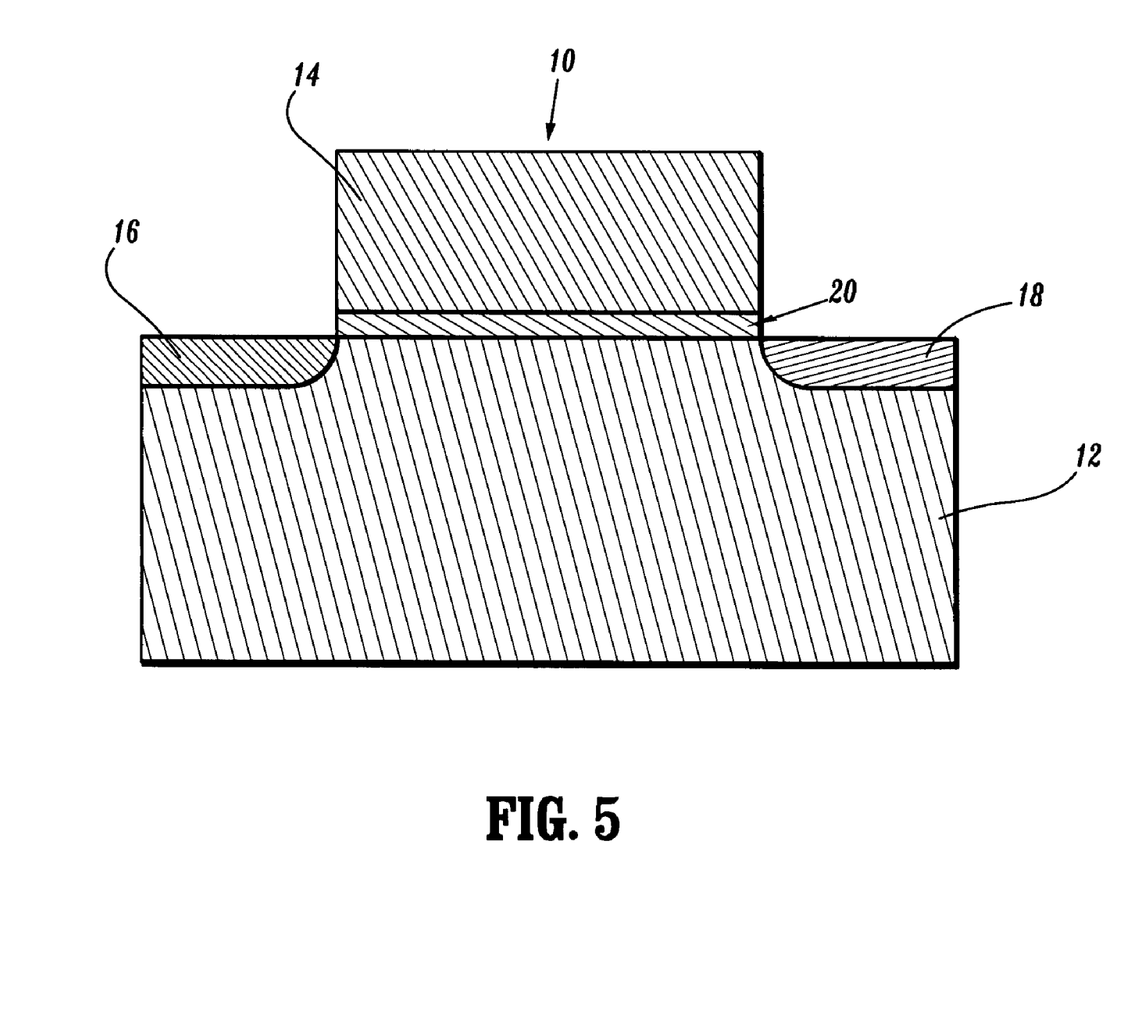
FIG. 5 is a cross-sectional view of a field effect transistor having a gate dielectric according to an exemplary embodiment of the invention.

FIG. 5 is a cross-section view of a Field Effect Transistor incorporating a gate dielectric in accordance with exemplary embodiments of the present invention. Referring to FIG. 5, a cross-sectional view of a gate stack 10 incorporating a gate dielectric 20 in accordance with the embodiments of the present invention is shown. The gate dielectric 20 is built on a silicon substrate 12 and subsequently, a polysilicon gate 14 is formed on top of the gate dielectric 20. The silicon substrate further includes a source region 16 and a drain region 18.

While this invention has been particularly shown and described with reference to the exemplary embodiments thereof, it will be understood by those skilled in the art that various changes in form and detail may be made without departing from the spirit and scope of the invention.

What is claimed is:

1. A method of forming a dielectric layer of a semiconductor device, comprising the steps of:
   growing an oxynitride layer of a semiconductor device, wherein the oxynitride layer is grown to a thickness in a range of about 12 to about 24 angstroms; and
   annealing the oxynitride layer at a temperature of about 400° C. for about 20 minutes, wherein the annealing is performed in a nitrogen ambient including an oxygen concentration of less than about 1 part per billion.

2. The method of claim 1, further comprising the step of:
   capping the annealed oxynitride layer with a gate, wherein the gate is silicon, polysilicon, germanium, silicon-germanium, any other semiconductor material, or a metal.

3. The method of claim 2, wherein the metal is aluminum.

4. The method of claim 2, wherein the growing of the oxynitride layer is carried out by using a plasma nitridation process.

5. A Field Effect Transistor having a gate dielectric, wherein the gate dielectric is formed using the method of claim 1.

6. A capacitor having a dielectric layer, wherein the dielectric layer is formed using the method of claim 1.

7. A MIM capacitor having a dielectric layer, wherein the dielectric layer is formed using the method of claim 1.

8. A method of forming a dielectric layer within a semiconductor device, comprising the steps of:
   growing an oxynitride layer on a semiconductor device;
   annealing the oxynitride layer at a temperature of about 400° C. for about 20 minutes, wherein the annealing is performed in a nitrogen ambient including an oxygen concentration of less than about 1 part per billion; and
   capping the annealed oxynitride layer with a gate.

9. The method of claim 8, wherein the gate is silicon, polysilicon, germanium, silicon-germanium, any other semiconductor material, or a metal.

10. The method of claim 9, wherein the metal is aluminum.

11. The method of claim 8, wherein the growing of the oxynitride layer is carried out by using a plasma nitridation process.

12. The method of claim 8, wherein the annealing further comprises preheating the semiconductor substrate to a temperature of about 400° C.

13. A Field Effect Transistor having a gate dielectric, wherein the gate dielectric is formed using the method of claim 8.

14. A method for forming a dielectric layer on a semiconductor device, comprising the steps of:
   growing an oxynitride layer on a semiconductor device in a processing chamber;
   preheating the semiconductor device to a temperature of about 400° C.;
   annealing the oxynitride layer for about 20 minutes at a temperature of about 400° C.; and
   cooling the semiconductor device with the annealed oxynitride layer.

15. The method of claim 14, wherein the preheating step is performed for about 4 minutes.

16. The method of claim 14, wherein the cooling step is performed for about 4 to 10 minutes.

17. The method of claim 14, wherein the cooling step is performed until the semiconductor device is at a temperature in a range of about 25 to about 300° C.

18. The method of claim 14, wherein the annealing is performed in a nitrogen ambient or a nitrogen ambient including an oxygen concentration of about 1 to about 10 parts per billion.

19. The method of claim 14, wherein the oxynitride layer is grown to a thickness in a range of about 12 to about 24 angstroms.

20. The method of claim 14, further comprising the step of:
   capping the annealed oxynitride layer with a gate.

21. The method of claim 20, wherein the gate is silicon, polysilicon, germanium, silicon-germanium, any other semiconductor material, or a metal.

22. The method of claim 21, wherein the metal is aluminum.

23. The method of claim 14, wherein the growing of the oxynitride layer is carried out by using a plasma nitridation process.

24. A Field Effect Transistor having a gate dielectric layer, wherein the gate dielectric layer is formed using the method of claim 14.

25. A capacitor having a dielectric layer, wherein the dielectric layer is formed using the method of claim 14.

26. A MIM capacitor having a dielectric layer, wherein the dielectric layer is formed using the method of claim 14.

27. A method of forming a dielectric layer of a semiconductor device, comprising the steps of:
   growing an oxynitride layer of a semiconductor device;
   depositing a gate electrode layer on the oxynitride layer; and
   annealing the oxynitride layer and gate electrode layer at a temperature of about 400° C. for about 20 minutes, wherein the annealing is performed in a nitrogen ambient including an oxygen concentration of about 1 to about 10 parts per billion.

28. The method of claim 27, wherein the oxynitride layer is grown to a thickness in a range of about 12 to about 24 angstroms.

29. The method of claim 27, wherein the growing of the oxynitride layer is carried out by using a plasma nitridation process.

30. The method of claim 27, wherein the gate electrode layer is silicon, polysilicon, germanium, silicon-germanium, any other semiconductor material, or a metal.

31. A method of forming a dielectric layer of a semiconductor device, comprising the steps of:
   growing an oxynitride layer of a semiconductor device;
   depositing a gate electrode layer on the oxynitride layer; and
   annealing the oxynitride layer and gate electrode layer at a temperature of about 400° C. for about 20 minutes, wherein the annealing is performed in a nitrogen ambient including an oxygen concentration of less than about 1 part per billion.

* * * * *